US012696628B2

(12) United States Patent
Shin et al.

(10) Patent No.: US 12,696,628 B2
(45) Date of Patent: Jul. 28, 2026

(54) DISPLAY DEVICE AND MANUFACTURING METHOD THEREOF

(71) Applicant: Samsung Display Co., LTD., Yongin-si (KR)

(72) Inventors: Hyun Eok Shin, Yongin-si (KR); Dong Min Lee, Yongin-si (KR); Woo-Seok Jeon, Yongin-si (KR); Yung Bin Chung, Yongin-si (KR); Yu-Gwang Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 315 days.

(21) Appl. No.: 18/519,369

(22) Filed: Nov. 27, 2023

(65) Prior Publication Data

US 2024/0292667 A1    Aug. 29, 2024

(30) Foreign Application Priority Data

Feb. 27, 2023    (KR) ......................... 10-2023-0025915

(51) Int. Cl.
*H10K 59/122*        (2023.01)
*H10K 59/12*        (2023.01)
*H10K 59/80*        (2023.01)

(52) U.S. Cl.
CPC ....... *H10K 59/122* (2023.02); *H10K 59/1201* (2023.02); *H10K 59/80522* (2023.02)

(58) Field of Classification Search
None
See application file for complete search history.

(56) References Cited

U.S. PATENT DOCUMENTS

2022/0209186 A1*   6/2022   Shim .................... H10K 50/844

FOREIGN PATENT DOCUMENTS

| CN | 112331807 | 2/2021 |
| KR | 10-2021-0017179 | 2/2021 |
| KR | 10-2021-0086287 | 7/2021 |
| KR | 10-2022-0036556 | 3/2022 |

* cited by examiner

*Primary Examiner* — Kyoung Lee
(74) *Attorney, Agent, or Firm* — Sughrue Mion, PLLC

(57)        ABSTRACT

A display device includes a plurality of transistors disposed on a substrate, an insulating layer disposed on the transistors, a first electrode disposed on the insulating layer and electrically connected to the transistors, a partition wall disposed on the insulating layer, a common layer disposed on the partition wall and the first electrode, an emission layer disposed on the common layer, a second electrode disposed on the emission layer, and an auxiliary layer disposed on the second electrode. The partition wall includes a groove, and an inner width of the groove is greater than an inlet width of the groove.

20 Claims, 16 Drawing Sheets

DISPLAY DEVICE AND MANUFACTURING METHOD THEREOF

CROSS-REFERENCE TO RELATED APPLICATION(S)

This application claims priority to and the benefits of Korean Patent Application No. 10-2023-0025915 under 35 U.S.C. § 119, filed on Feb. 27, 2023, in the Korean Intellectual Property Office (KIPO), the entire contents of which are incorporated herein by reference.

BACKGROUND

1. Technical Field

The disclosure relates to a display device preventing a leakage of current between neighboring pixels and improving contact and manufacturing method thereof.

2. Description of the Related Art

An emission display device is a self-luminous type of display device that emits light by recombination of electrons and holes in an emission layer by applying a voltage to a thin film layer including a positive electrode, a negative electrode, and the emission layer positioned between the two electrodes. The emission display device is attracting attention as a next-generation display device thanks to advantages such as a wide viewing angle, a fast response speed, and low power consumption, as well as being lightweight and thin.

The emissive display device includes a light emitting device (LED). The emissive display device has a structure in which a light emitting layer in the form of a functional thin film is inserted between an anode and a cathode, wherein holes are injected from the anode and electrons are injected from the cathode, and the electrons and the holes are combined in the emission layer to form excitons, which emit light as they recombine.

Recently, as a high-resolution display device is used, a size of one pixel is reduced and a distance between adjacent pixels is narrowed.

SUMMARY

Embodiments have been made in an effort to provide a display device and a manufacturing method thereof, which prevents a side current leakage in a high-resolution display device and improves electrode contact.

According to an embodiment of the disclosure, a display device may include a plurality of transistors disposed on a substrate, an insulating layer disposed on the plurality of transistors, a first electrode disposed on the insulating layer and electrically connected to the plurality of transistors, a partition wall disposed on the insulating layer, a common layer disposed on the partition wall and the first electrode, an emission layer disposed on the common layer, a second electrode disposed on the emission layer, and an auxiliary layer disposed on the second electrode. The partition wall may include a groove, and an inner width of the groove may be greater than an inlet width of the groove.

A thickness of the auxiliary layer may be in a range of about 30 Å to about 200 Å.

A thickness of the auxiliary layer may be uniform.

The auxiliary layer may include titanium nitride (TiN).

The auxiliary layer may include a metal, and a thickness of the auxiliary layer may be equal to or less than about 50 Å.

The auxiliary layer may include at least one of W, Mo, Ta, Ti, and Al.

The auxiliary layer may include at least one of an indium tin oxide (ITO), an indium zinc oxide (IZO), a zinc tin oxide (ZTO), a copper indium oxide (CIO), a copper zinc oxide (CZO), a gallium zinc oxide (GZO), an aluminum zinc oxide (AZO), a tin oxide ($SnO_2$), a zinc oxide (ZnO), and an indium gallium zinc oxide (IGZO).

A width of an inside of the groove may be greater than or equal to about 1.5 times of a width of an inlet of the groove.

A width of an inlet of the groove may be in a range of about 0.5 μm to about 3 μm.

The partition wall may include an inorganic material.

The common layer may be disposed in the groove.

The common layer disposed on the first electrode may be separated by the groove.

The common layer may be a hole injection layer.

The emission layer may block an inlet of the groove.

The emission layer may be disposed in the groove.

A height of the groove may be greater than a thickness of the common layer and less than a thickness of the emission layer.

According to an embodiment of the disclosure, a manufacturing method of a display device may include preparing a substrate including a plurality of transistors and a first electrode connected to the plurality of transistor, forming a metal pattern on the substrate, forming a partition wall on the metal pattern, patterning the partition wall to form an opening overlapping the metal pattern in a plan view, forming a groove in the partition wall by etching the metal pattern, forming a common layer on the partition wall and the first electrode, forming an emission layer on the common layer, forming a second electrode on the emission layer, and forming an auxiliary layer on the second electrode. The forming of the auxiliary layer may be performed by an atomic layer deposition method.

A thickness of the auxiliary layer may be in a range of about 30 Å to about 200 Å.

The auxiliary layer may include at least one of TiN, W, Mo, Ta, Ti, Al, an indium tin oxide (ITO), an indium zinc oxide (IZO), a zinc tin oxide (ZTO), a copper indium oxide (CIO), a copper zinc oxide (CZO), a gallium zinc oxide (GZO), an aluminum zinc oxide (AZO), a tin oxide ($SnO_2$), a zinc oxide (ZnO), and an indium gallium zinc oxide (IGZO).

The common layer may be disposed in the groove.

According to the embodiments, it is possible to provide a display device and a manufacturing method thereof, which prevents a side current leakage in a high-resolution display device and improves electrode contact.

DETAILED DESCRIPTION OF THE EMBODIMENTS

Figure 1:
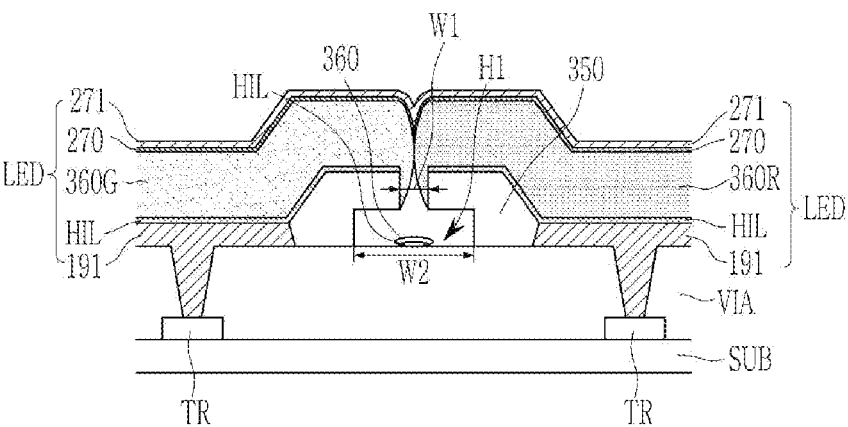
FIG. 1 is a schematic cross-sectional view of a display device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

To clearly describe the embodiments, parts that are irrelevant to the description are omitted, and like numerals refer to like or similar constituent elements throughout the specification.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Further, throughout the specification, the phrase "in a plan view" means when an object portion is viewed from above, and the phrase "in a cross-sectional view" means when a cross-section taken by vertically cutting an object portion is viewed from the side.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a schematic cross-sectional view of a display device according to an embodiment. Referring to FIG. 1, the display device according to an embodiment may include a substrate SUB and multiple transistors TR positioned on the substrate SUB. The substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate SUB may be a rigid substrate or a flexible substrate capable of bending, folding, rolling, or the like. The substrate SUB may be a single layer or a multilayer. In the substrate SUB, at least one base layer including a polymer resin sequentially stacked and at least one inorganic layer may be alternately stacked each other.

The transistors TR may each include a semiconductor, a gate electrode, a source electrode, and a drain electrode. An insulating layer VIA may be positioned on the transistors TR. The insulating layer VIA may include an organic insulating material such as a general purpose polymer, e.g., poly(methyl methacrylate) (PMMA) or polystyrene (PS), a polymer derivative having a phenolic group, an acrylic polymer, an imide polymer, polyimide, a siloxane polymer, etc. For example, the insulating layer VIA may include polyimide.

A first electrode 191 may be positioned on the insulating layer VIA. The first electrode 191 may be electrically connected to the transistor TR to receive a voltage, and may be connected to a drain electrode (not illustrated) of the transistor TR. The first electrode 191 may include a transparent conductive oxide, e.g., an indium tin oxide (ITO).

Referring to FIG. 1, a partition wall 350 may be positioned on the first electrode 191. The partition wall 350 may include an inorganic material. The partition wall 350 may include at least one of a silicon oxide ($SiO_x$), a silicon nitride ($SiN_x$), a silicon oxynitride ($SiO_xN_y$), and an amorphous silicon (Si). Although FIG. 1 illustrates that the partition wall 350 has a single layer, the disclosure is not limited thereto, and the partition wall 350 may be multi-layered according to another embodiment.

The partition wall 350 may include a groove H1. The groove H1 may have a structure in which an inner width W2 is wider than a width W1 of an inlet of the groove in a direction. The groove H1 may disconnect a common layer of neighboring pixels, thereby preventing a side leakage current between neighboring pixels in a high-resolution display device.

The width W2 of the inside of the groove H1 may be about 1.5 times greater than the width W1 of the inlet. As described below, in case that the inner width W2 of the groove H1 is less than about 1.5 times the width W1 of the inlet, a hole injection layer HIL may not be sufficiently disconnected. For example, the width W1 of the inlet of the groove H1 may be in a range of about 0.5 μm to about 3 μm.

A height of the groove H1 may be greater than a thickness of the hole injection layer HIL that is formed after the groove H1 is formed, and may be less than a thickness of the emission layer. Since the height of the groove H1 is greater than the thickness of the hole injection layer HIL, the hole injection layer HIL may be effectively disconnected. Since the height of the groove H1 is less than the thickness of the emission layer, the inlet of the groove H1 may be covered by the emission layer.

Referring to FIG. 1, the hole injection layer HIL may be disposed on the first electrode 191. The hole injection layer HIL may be commonly disposed on multiple first electrodes 191 connected to the respective transistors TR.

As illustrated in FIG. 1, the hole injection layers HIL, which are commonly disposed in the respective first electrodes 191, may be separated from each other by the groove H1 of the partition wall 350. As illustrated in FIG. 1, in the process of forming the hole injection layer HIL, the hole injection layer HIL may be formed inside the groove H1 of the partition wall 350, and the hole injection layers HIL of neighboring pixels may be completely separated and not connected to each other. Accordingly, it is possible to solve the problem of side the leakage current occurring between the hole injection layers HIL of neighboring pixels. Effects of the disclosure will be separately described in detail below.

Referring to FIG. 1, the hole injection layer HIL may be disposed in the groove H1. In the process of forming the hole injection layer HIL, a material of the hole injection layer HIL may be deposited in the groove H1 instead of an upper portion of the partition wall 350, and as the hole injection layer HIL is formed inside the groove H1, hole injection layers HIL of neighboring pixels may be separated from each other without being connected to each other.

Referring to FIG. 1, an emission layer 360 may be disposed on the hole injection layer HIL. As illustrated in FIG. 1, the emission layer 360 emitting a different color may be disposed for each pixel. In FIG. 1, a red emission layer 360R and a green emission layer 360G are illustrated, and although not illustrated in FIG. 1, a blue emission layer (not illustrated) may be disposed in a pixel adjacent thereto. However, the disclosure is not limited thereto, and in an embodiment, the display device may include neighboring pixels emitting light of a same color by including same emission layers.

Referring to FIG. 1, the emission layer 360 may be disposed inside the groove H1. A material of the emission layer 360 may be deposited in the groove H1 during formation of the emission layer 360. After formation of the emission layer 360, the inlet of the groove H1 may be blocked by the emission layer 360. For example, as illustrated in FIG. 1, after formation of the emission layer 360 having a thickness, the inlet of the groove H1 may be covered with the emission layer 360 and closed. Accordingly, a layer deposited after the emission layer 360 in a subsequent process may not be formed inside the groove H1.

Referring to FIG. 1, a second electrode 270 may be disposed on the emission layer 360. The second electrode 270 may be commonly positioned in the pixels. As described above, the inlet of the groove H1 of the partition wall 350 may be blocked by the emission layer 360, and thus the second electrode 270 may be integrally formed over the entire pixels without being cut off by the groove H1.

An auxiliary layer 271 may be disposed on the second electrode 270. The auxiliary layer 271 may be deposited and formed by atomic layer deposition (ALD), and may have a very thin thickness. For example, a thickness of the auxiliary layer 271 may be in a range of about 30 Å to about 200 Å. The auxiliary layer 271 may be a transparent layer.

The auxiliary layer 271 may compensate for an incomplete connection of the second electrode 270 in a portion corresponding to the groove H1 to ensure a good connection of the second electrode 270. For example, since an upper portion of the groove H1 is not flat, a portion of the second electrode 270 overlapping the groove H1 in a plan view may be disconnected. However, in case that the auxiliary layer 271 is formed on the second electrode 270, disconnection of the second electrode 270 may be prevented.

The auxiliary layer 271 may be formed by atomic layer deposition. Accordingly, the auxiliary layer 271 may be formed with a uniform thickness regardless of curvature of a deposition surface. Since the auxiliary layer 271 is formed with a uniform thickness regardless of the curvature of the deposition surface, the auxiliary layer 271 may be formed without disconnection even on a curved area overlapping the groove H1.

Figure 2:
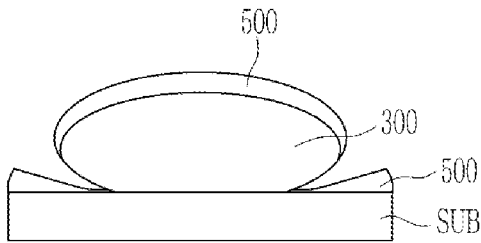
FIG. 2 is a schematic cross-sectional view of a deposition layer deposited by sputtering on a curved surface.
Figure 3:
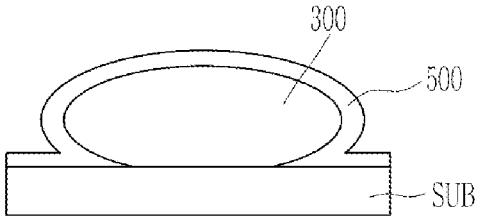
FIG. 3 is a schematic cross-sectional view of a deposition layer deposited by atomic layer deposition on a curved surface.

FIG. 2 is a schematic cross-sectional view of a deposition layer 500 deposited on a curved surface 300 using sputtering. Referring to FIG. 2, in case that a physical vapor deposition (PVD) method using sputtering is used, the deposition layer 500 may not be disposed on a covered surface of the curved surface 300. FIG. 3 is a schematic cross-sectional view of the deposition layer 500 deposited by atomic layer deposition on a curved surface 300. In case that an atomic layer deposition (ALD) method is used, regardless of the shape of the curved surface 300, the deposition layer 500 may be formed with uniform step coverage on the curved surface 300. Accordingly, in an embodiment, even a portion of the auxiliary layer 271 overlapping the groove H1 in a plan view may be formed with a uniform thickness, thereby preventing disconnection.

The auxiliary layer 271 may include TiN. The auxiliary layer 271 may be formed as a thin metal layer. For example, the auxiliary layer 271 may include at least one of W, Mo, Ta, Ti, and Al. In case that the auxiliary layer includes a metal, the thickness of the auxiliary layer 271 may be less than or equal to about 50 Å in consideration of transmittance of light. The auxiliary layer 271 may include a transparent conductive oxide. For example, the auxiliary layer 271 may include at least one of an indium tin oxide (ITO), an indium zinc oxide (IZO), a zinc tin oxide (ZTO), a copper indium oxide (CIO), a copper zinc oxide (CZO), a gallium zinc oxide (GZO), an aluminum zinc oxide (AZO), a tin oxide (SnO$_2$), a zinc oxide (ZnO), and an indium gallium zinc oxide (IGZO).

The first electrode 191, the hole injection layer HIL, the emission layer 360, the second electrode 270, and the auxiliary layer 271 may constitute a light emitting device LED. Although not illustrated, a hole transport layer positioned between the hole injection layer HIL and the emission layer 360, and an electron transport layer and an electron injection layer disposed between the emission layer 360 and the second electrode 270 may be further included the display device. A hole transport layer, an electron transport layer, and an electron injection layer may also be commonly disposed in the pixels.

As described above, in the display device according to an embodiment, the partition wall 350 may include a groove H1. The groove H1 may separate a common layer between neighboring pixels, e.g., the hole injection layer HIL, from each other without being connected to each other, thereby solving a problem of a leakage current between neighboring pixels. The display device according to an embodiment may further include an auxiliary layer 271 to prevent disconnection of the second electrode 270 and improve connection.

Figure 4:
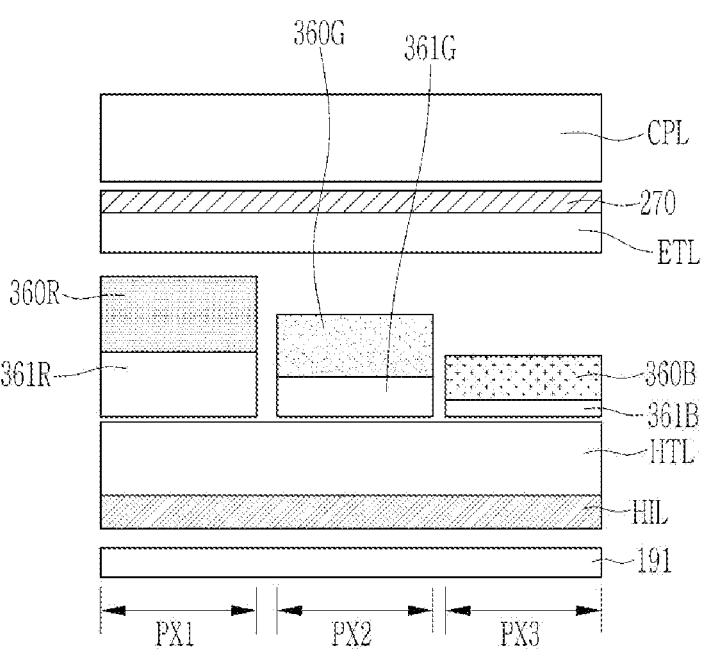
FIG. 4 is a schematic cross-sectional view illustrating a stacked structure of multiple pixels.

FIG. 4 is a schematic cross-sectional view illustrating a stacked structure of multiple pixels. Referring to FIG. 4, the hole injection layer HIL may be disposed on the first electrode 191. In FIG. 4, a configuration common to the pixels PX1, PX2, and PX3 is shown as a single unit. The first electrode 191 and the hole injection layer HIL may be commonly disposed in the pixels PX1, PX2, and PX3. Similarly, the hole transport layer HTL may also be commonly positioned in each of the pixels PX1, PX2, and PX3.

The first pixel PX1 may include a first auxiliary layer 361R and a first emission layer 360R. The second pixel PX2 may include a second auxiliary layer 361G and a second emission layer 360G. The third pixel PX3 may include a third auxiliary layer 361B and a third emission layer 360B.

An electron transport layer ETL may be commonly disposed on the first emission layer 360R, second emission layer 360G and third emission layer 360B. The second electrode 270 may be disposed on the electron transport layer ETL, and a capping layer CPL may be disposed on the second electrode 270.

As illustrated in FIG. 4, each pixel may include a common hole injection layer to improve a hole injection characteristic. The hole injection layer HIL may be a doped hole transport layer. For example, the hole injection layer HIL, which is a doped layer, may have higher electrical conductivity than an electrical conductivity of the hole transport layer. Accordingly, a side leakage current problem may occur due to conductive characteristics.

In case that the leakage current occurs, an efficiency of a pixel may decrease, color purity may deteriorate, and neighboring pixels may weakly lit due to leakage current, which may cause color mixing.

Figure 5:
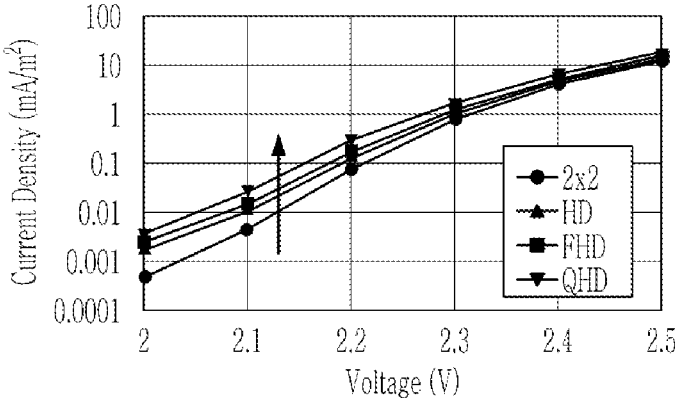
FIG. 5 illustrates a current density according to a voltage in case that a resolution is 2×2, HD, FHD, and QHD.

For example, in a high resolution display device, since a distance between adjacent pixels is narrow, an impact of such a leakage current problem may be more severe. FIG. 5 illustrates a current density according to a voltage in case that a resolution is 2×2, HD, FHD, and QHD. Referring to FIG. 5, it can be seen that as resolution increases (2×2, HD, FHD, QHD), a current density increase.

Figure 6:
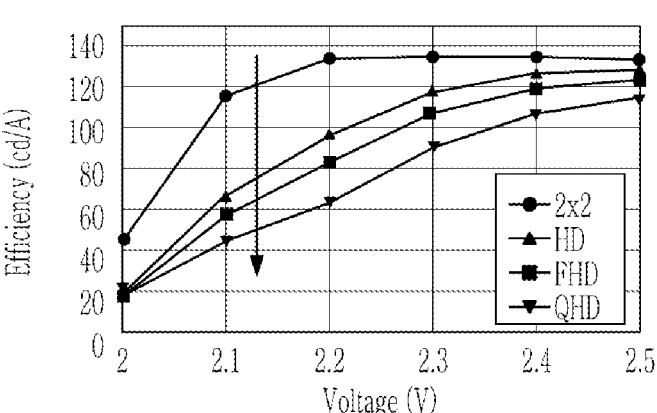
FIG. 6 illustrates an efficiency according to a voltage in case that a resolution is 2×2, HD, FHD, and QHD.

FIG. 6 illustrates an efficiency according to a voltage in case that a resolution is 2×2, HD, FHD, and QHD. Referring to FIG. 6, it can be seen that as resolution increases (2×2, HD, FHD, QHD), efficiency decreases. This is because, as described above, as the resolution increases, the distance between adjacent pixels narrows, and the leakage current increases.

However, in the display device according to an embodiment, as described above, the partition wall 350 positioned between adjacent pixels may include a groove H1, and thus a common layer such as the hole injection layer HIL may be separated, and leakage current may be prevented from occurring.

For example, the partition wall 350 according to an embodiment may have a shape in which the inner width W2 is wider than the width W1 of the inlet of the groove, and thus the common layer may be completely separated and disconnected.

Figure 7:
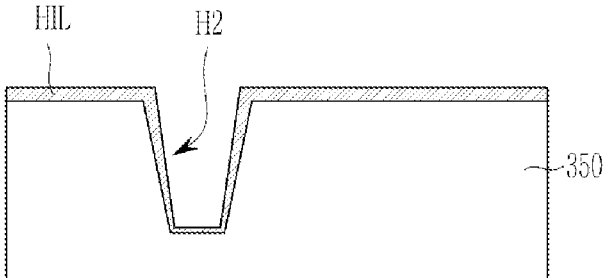
FIG. 7 is a schematic cross-sectional view of a partition wall including a groove having a general shape.
Figure 8:
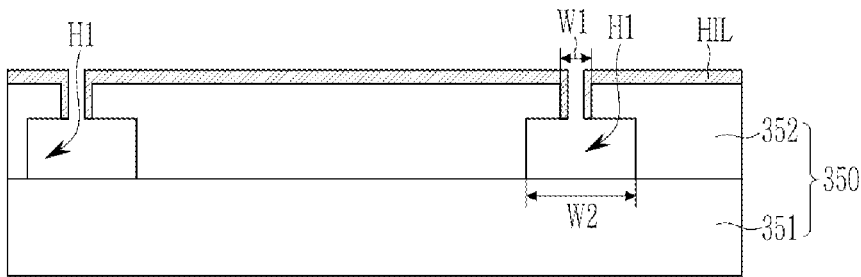
FIG. 8 is a schematic cross-sectional view of a partition wall including a groove with an inner width wider than a width of an inlet of the groove.

FIG. 7 is a schematic cross-sectional view of a partition wall including a groove H2 having a general shape. FIG. 8 is a schematic cross-sectional view of a partition wall including a groove H1 with the inner width W2 wider than the width W1 of an inlet of the groove H1.

Referring to FIG. 7, in case that a general-shaped groove H2 is formed in the partition wall 350, the hole injection layer HIL may not be completely disconnected. For example, as illustrated in FIG. 7, the hole injection layer HIL may be connected along a surface of the groove H2, and a leakage current may not be completely controlled due to incomplete disconnection.

However, in the embodiment of FIG. 8, the hole injection layer HIL may include a groove H1 having the inner width W2 that is wider than the inlet width W1, and the hole injection layer HIL may be effectively disconnected. As illustrated in FIG. 8, the hole injection layer HIL may be completely disconnected without being connected to each other due to a space inside the groove H1.

Figure 9:
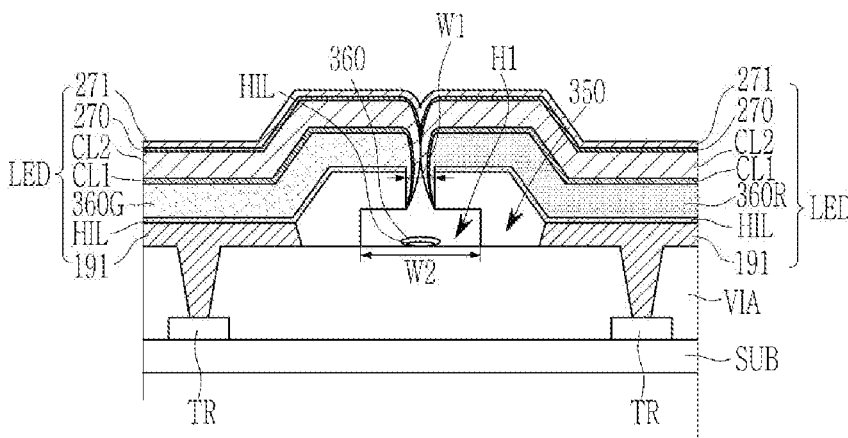
FIG. 9 is a schematic cross-sectional view of a display device according to another embodiment.

FIG. 9 is a schematic cross-sectional view of a display device according to another embodiment. A light emitting device LED of FIG. 9 may include a first electrode 191, a hole injection layer HIL, an emission layer 360, a first common layer CL1, a second common layer CL2, and a second electrode 270, and an auxiliary layer 271. For example, the display device of FIG. 9 and the display device of FIG. 1 may be different at least in that the display device of FIG. 9 may include the first common layer CL1 and the second common layer CL2, and a detailed description of the same configuration is omitted. The first common layer CL1 may be a conductive common layer, e.g., a charge generation layer. The second common layer CL2 may be an electron injection layer or an electron transport layer. Even in the embodiment of FIG. 9, incomplete connection of the second electrode 270 formed by the groove H1 of the partition wall 350 may be supplemented with the auxiliary layer 271. The auxiliary layer 271 may contact the second electrode 270 and may be deposited by ALD method to have a constant thickness even on a curved surface positioned above the groove H1, and thus may prevent disconnection of the second electrode 270 and may connect the second electrode 270.

Figure 10:
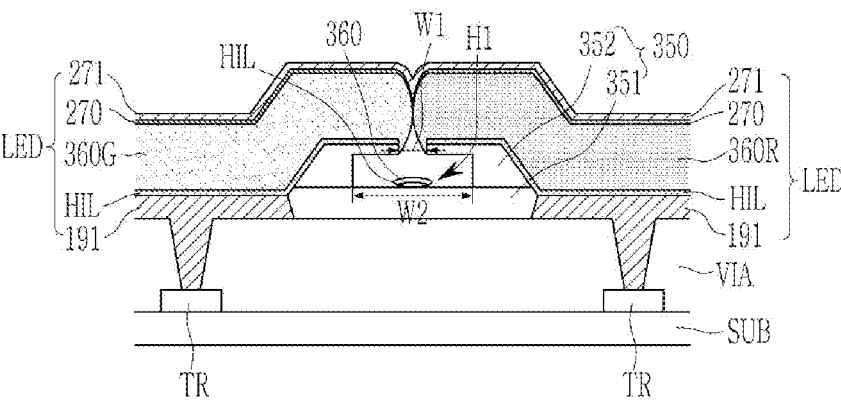
FIG. 10 is a schematic cross-sectional view of a display device according to another embodiment.

FIG. 10 is a schematic cross-sectional view of a display device according to another embodiment. Referring to FIG. 10, in the display device according to an embodiment, the partition wall 350 may have a stacked structure including a first layer 351 and a second layer 352, and the display device of FIG. 10 and the display device of FIG. 1 may be different at least in that the groove H1 is positioned in the second layer 352. A detailed description of the same constituent elements will be omitted. The first layer 351 and the second layer 352 may include an inorganic material. For example, the first layer 351 and the second layer 352 of the partition wall 350 may each include at least one of a silicon oxide $(SiO_x)$, a silicon nitride $(SiN_x)$, a silicon oxynitride $(SiO_xN_y)$, and an amorphous silicon (Si). The first layer 351 and the second layer 352 may include different materials or a same material.

Hereinafter, a process of forming the display device according to the embodiment of FIG. 10 will be described with reference to FIG. 11 to FIG. 16. FIG. 11 to FIG. 16 are schematic cross-sectional views each illustrating a manufacturing method of a display device according to an embodiment.

Figure 11:
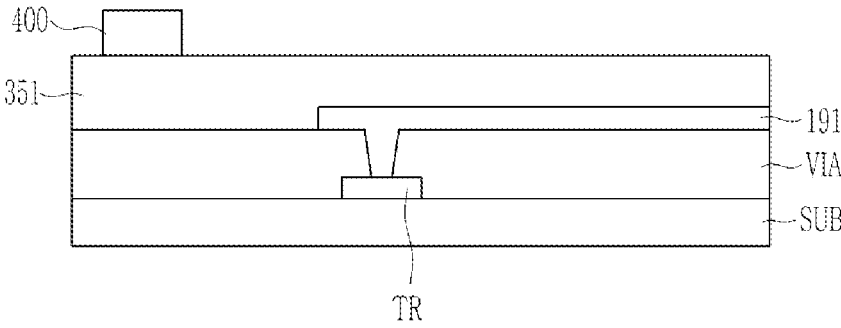
FIG. 11 to FIG. 16 are schematic cross-sectional views each illustrating a manufacturing method of a display device according to an embodiment.

Referring to FIG. 11, the first layer 351 of the partition wall may be disposed on the first electrode 191. The first layer 351 may include an inorganic material. For example, the first layer 351 of the partition wall 350 may include at least one of a silicon oxide $(SiO_x)$, a silicon nitride $(SiN_x)$, a silicon oxynitride $(SiO_xN_y)$, and an amorphous silicon (Si).

A metal pattern 400 may be positioned on the first layer 351 of the partition wall. The metal pattern 400 may be a structure for forming the groove of the partition wall. The metal pattern 400 may include molybdenum or aluminum. However, a material of the metal pattern 400 is not limited thereto.

A thickness of the metal pattern 400 may be greater than a thickness of the hole injection layer HIL formed after formation of the metal pattern 400. The thickness of the metal pattern 400 may be less than a thickness of an emission layer formed after the formation of the metal pattern 400. As such, in case that the thickness of the metal pattern 400 is thicker than the thickness of the hole injection layer HIL and thinner than the thickness of the emission layer, the groove H1 formed by the metal pattern 400 may effectively disconnect the hole injection layer HIL. In case that the thickness of the metal pattern 400 is less than the thickness of the light emitting layer, the inlet of the groove H1 may be effectively covered. In a process of patterning the metal pattern 400, a mask may be used.

Figure 12:
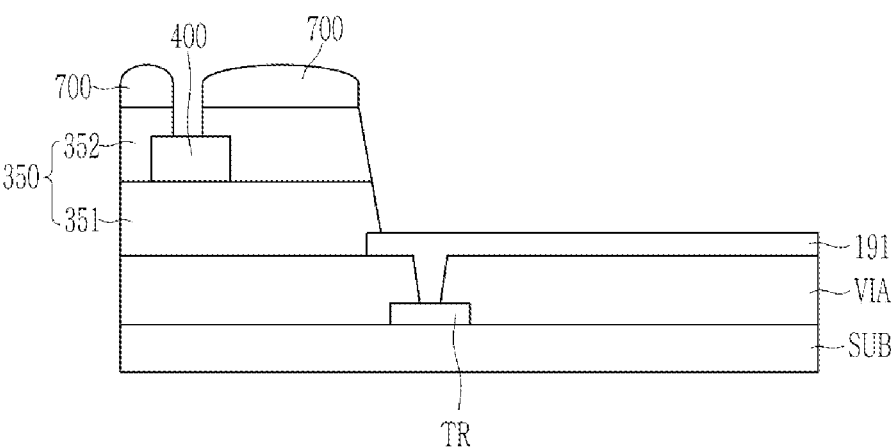

Referring to FIG. 12, the second layer 352 of the partition wall may be formed. The second layer 352 may include an inorganic material. For example, the second layer 352 of the partition wall 350 may include at least one of a silicon oxide $(SiO_x)$, a silicon nitride $(SiN_x)$, a silicon oxynitride $(SiO_xN_y)$, and an amorphous silicon (Si). The second layer 351 and the first layer 352 may include a same material or different materials.

After forming the second layer 352, a portion of the first layer 351 and the second layer 352 overlapping the first electrode 191 in a plan view may be removed. A portion of the second layer 352 overlapping the metal pattern 400 in a plan view may be removed to expose the metal pattern 400. In this process, a mask 700 may be used. In case that the metal pattern 400 includes molybdenum, only the second layer 352 may be etched without etching the metal pattern 400 because an etching selectivity of molybdenum is greater than an inorganic film.

Figure 13:
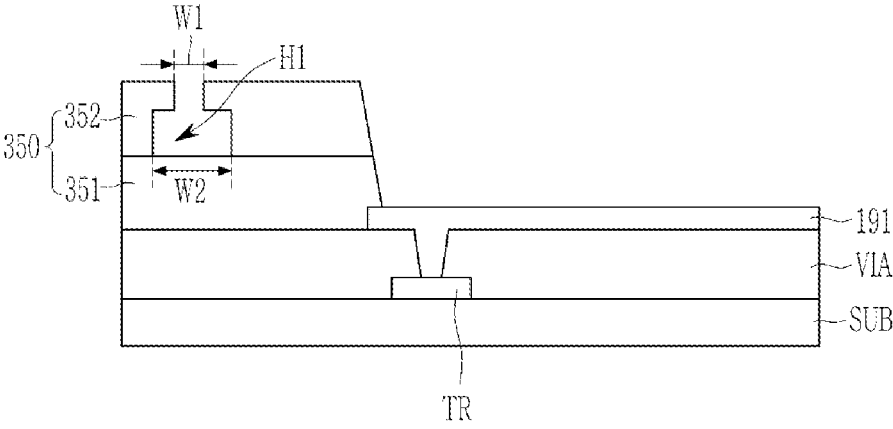

Referring to FIG. 13, the metal pattern 400 may be removed. The removal of the metal pattern 400 may be performed using wet etching. The groove H1 having an inner width W2 wider than the width W1 may be formed by removing the metal pattern 400.

Figure 14:
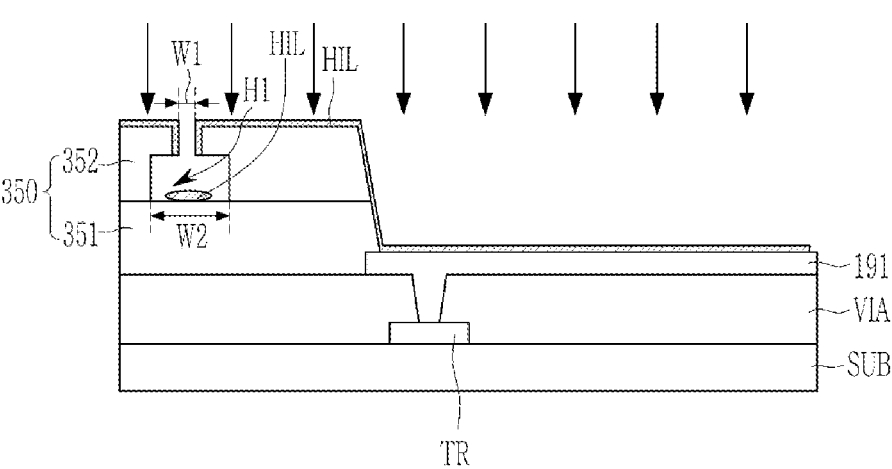

Referring to FIG. 14, the hole injection layer HIL may be formed. The hole injection layer HIL may be disconnected by the groove H1. For example, as illustrated in FIG. 14, while the hole injection layer HIL is formed inside the groove H1, the hole injection layer HIL may be disconnected from an upper portion of the partition wall 350 without being connected. The disconnection of the hole injection layer HIL may prevent a leakage current.

Figure 15:
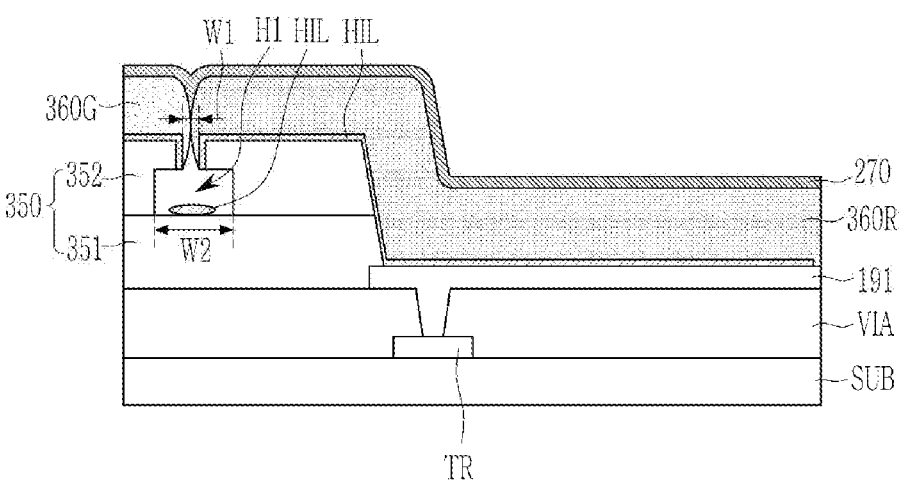

Referring to FIG. 15, the emission layer 360 and the second electrode 270 may be formed.

Figure 16:
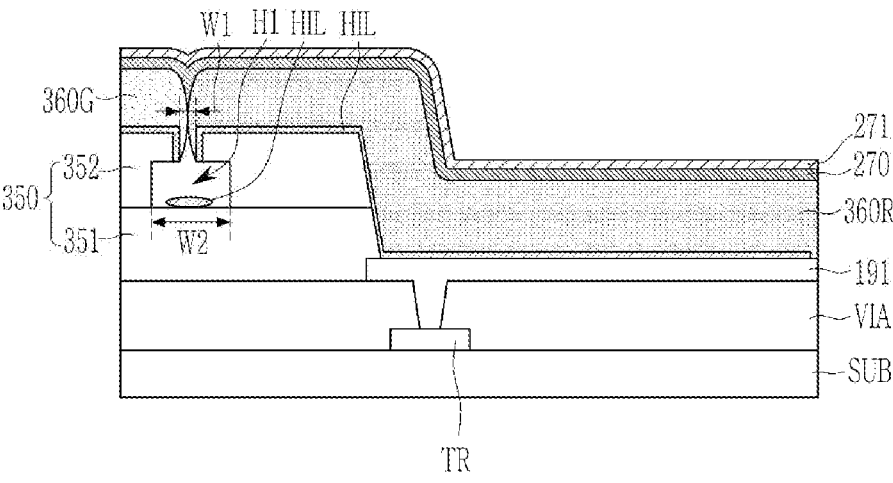

Referring to FIG. 16, an auxiliary layer 271 may be disposed on the second electrode 270. The auxiliary layer 271 may be formed by an ALD method. A description of the auxiliary layer 271 is omitted as it is the same as described above.

As described above, in accordance with the display device and a manufacturing method thereof according to an embodiment, the partition wall 350 may include a groove H1, and the groove H1 may have a wider inner width W2 than the inlet width W1. A common layer of neighboring pixels, e.g., a hole injection layer, may be disconnected by the groove H1, thereby preventing generation of a leakage current between neighboring pixels. Accordingly, the side current leakage may be prevented in a high-resolution display device, and efficiency and color purity of a pixel may be improved.

The display device according to an embodiment may further include an auxiliary layer 271 positioned on the second electrode 270. The auxiliary layer 271 may be deposited by an atomic layer deposition (ALD) method to have a thin and uniform thickness, and even in the curved area overlapping the groove H1, the auxiliary layer 271 may be formed with a uniform thickness, thereby connecting the second electrode 270 and preventing disconnection.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a plurality of transistors disposed on a substrate;
an insulating layer disposed on the plurality of transistors;
a first electrode disposed on the insulating layer and electrically connected to the plurality of transistors;
a partition wall disposed on the insulating layer;
a common layer disposed on the partition wall and the first electrode;
an emission layer disposed on the common layer;
a second electrode disposed on the emission layer;
an auxiliary layer disposed on the second electrode;
wherein
the partition wall includes a groove, and
an inner width of the groove is greater than an inlet width of the groove.

2. The display device of claim 1, wherein a thickness of the auxiliary layer is in a range of about 30 Å to about 200 Å.

3. The display device of claim 1, wherein a thickness of the auxiliary layer is uniform.

4. The display device of claim 1, wherein the auxiliary layer includes titanium nitride (TiN).

5. The display device of claim 1, wherein the auxiliary layer includes a metal, and a thickness of the auxiliary layer is equal to or less than about 50 Å.

6. The display device of claim 5, wherein the auxiliary layer includes at least one of W, Mo, Ta, Ti, and Al.

7. The display device of claim 1, wherein the auxiliary layer includes at least one of an indium tin oxide (ITO), an indium zinc oxide (IZO), a zinc tin oxide (ZTO), a copper indium oxide (CIO), a copper zinc oxide (CZO), a gallium zinc oxide (GZO), an aluminum zinc oxide (AZO), a tin oxide ($SnO_2$), a zinc oxide (ZnO), and an indium gallium zinc oxide (IGZO).

8. The display device of claim 1, wherein a width of an inside of the groove is greater than or equal to about 1.5 times of a width of an inlet of the groove.

9. The display device of claim 1, wherein a width of an inlet of the groove is in a range of about 0.5 μm to about 3 μm.

10. The display device of claim 1, wherein the partition wall includes an inorganic material.

11. The display device of claim 1, wherein the common layer is disposed in the groove.

12. The display device of claim 1, wherein the common layer disposed on the first electrode is separated by the groove.

13. The display device of claim 1, wherein the common layer is a hole injection layer.

14. The display device of claim 1, wherein the emission layer blocks an inlet of the groove.

15. The display device of claim 1, wherein the emission layer is disposed in the groove.

16. The display device of claim 1, wherein a height of the groove is greater than a thickness of the common layer and less than a thickness of the emission layer.

17. A manufacturing method of a display device, comprising:

preparing a substrate including a plurality of transistors and a first electrode connected to the plurality of transistors;

forming a metal pattern on the substrate;

forming a partition wall on the metal pattern;

patterning the partition wall to form an opening overlapping the metal pattern in a plan view;

forming a groove in the partition wall by etching the metal pattern;

forming a common layer on the partition wall and the first electrode;

forming an emission layer on the common layer;

forming a second electrode on the emission layer; and forming an auxiliary layer on the second electrode, wherein the forming of the auxiliary layer is performed by an atomic layer deposition method.

18. The manufacturing method of claim 17, wherein a thickness of the auxiliary layer is in a range of about 30 Å to about 200 Å.

19. The manufacturing method of claim 17, wherein the auxiliary layer includes at least one of TiN, W, Mo, Ta, Ti, Al, an indium tin oxide (ITO), an indium zinc oxide (IZO), a zinc tin oxide (ZTO), a copper indium oxide (CIO), a copper zinc oxide (CZO), a gallium zinc oxide (GZO), an aluminum zinc oxide (AZO), a tin oxide ($SnO_2$), a zinc oxide (ZnO), and an indium gallium zinc oxide (IGZO).

20. The manufacturing method of claim 17, wherein the common layer is disposed in the groove.

* * * * *